United States Patent [19]

Mierzwinski

[11] 4,009,394
[45] Feb. 22, 1977

[54] REMOTE CONTROL LIGHT TRANSMITTER EMPLOYING A CYLINDRICAL LENS
[75] Inventor: Eugene P. Mierzwinski, Fort Wayne, Ind.
[73] Assignee: The Magnavox Company, Fort Wayne, Ind.
[22] Filed: Oct. 28, 1975
[21] Appl. No.: 626,164
[52] U.S. Cl. .............................. 250/552; 313/512; 350/190; 357/17
[51] Int. Cl.² .......................................... H01L 9/00
[58] Field of Search ............ 250/551, 552, 211 R, 250/211 J, 216, 239, 553; 357/17, 18, 30; 350/96 R, 96 WG, 190; 313/510, 512; 240/41.4

[56] References Cited
UNITED STATES PATENTS 3,396,344 8/1968 Broom .............................. 357/18
3,593,055 7/1971 Geusic et al. ..................... 250/552
3,694,902 10/1972 Apgar et al. ....................... 357/17
3,756,688 9/1973 Hudson et al. .................. 350/96 B
3,760,237 9/1973 Jaffe ................................. 357/17
3,875,456 4/1975 Kano et al. ....................... 357/17

Primary Examiner—David C. Nelms
Attorney, Agent, or Firm—Thomas A. Briody; William J. Streeter; George R. Pettit

[57] ABSTRACT

A light transmitter for use in a light activated T.V. remote control system. A modified cylindrical lens having a wide horizontal dispersion angle and a reduced vertical dispersion angle is directly coupled to a light emitting diode. The resulting combination provides a controlled light dispersion suitable for transmitting to a distant receiver location.

16 Claims, 4 Drawing Figures

REMOTE CONTROL LIGHT TRANSMITTER EMPLOYING A CYLINDRICAL LENS

DESCRIPTION OF THE PRIOR ART

Remote control systems for operating a television receiver are well known in the art. The operator initiates a command from a hand held transmitter. The transmitted command is usually a burst of ultrasonic energy or light energy which is directed toward the television receiver. The television receiver is equipped with a receiver for capturing the transmitted ultrasonic or light energy. This receiver provides an electrical signal which is decoded into a command which additional circuitry executes.

In one type of system for remotely controlling a television, a single ultrasonic frequency corresponds to each remotely controlled function or command. The receiver detects the presence of this signal and executes the command. Ultrasonic transmitters are efficient and the signal path loss is low. The ultrasonic signals are strongly reflected by many room surfaces. Thus, ultrasonic systems are not particularly sensitive to transmitter orientation with respect to the receiver. Ultrasonic noise is present, however, in most home environments. The use of home appliances which emit ultrasonic energy may initiate a false command in a system where a single frequency is used to initiate a command. A single frequency command system also makes impractical a larger number of function commands. Digital coding techniques in ultrasonic systems are not practical because of the reflections and propagation time of acoustic energy in an air medium.

Light activated remote control systems overcome some of the disadvantages of ultrasonic systems but have distinct disadvantages of their own, e.g., line of sight propagation and substantial path loss. Because light energy has a lower propagation time than ultrasonic energy, and a wider useable bandwidth, more functions may be defined and controlled than in ultrasonic systems. A pulse coding scheme also increases the noise immunity over a system which detects only the presence of a single frequency. Light energy however is subject to much greater path loss than ultrasonic energy. Additionally, transducers which convert electrical signals into light energy are not as efficient as their ultrasonic counterparts. To overcome the losses sustained by the light remote control link, it has been necessary to introduce more directivity into the remote control link than is found in the ultrasonic system. The operator must take care in aiming the transmitting source toward the light receiver. Since television styling restrictions limit the size of the light receiver aperture, the receiver gain is further limited thus making aiming of the transmitter at the receiver more critical. The present invention reduces the directivity requirement of previous light activated remote control systems without compromising the system reliability.

SUMMARY OF THE INVENTION

A light emitting diode (LED) is used to convert electrical energy into light energy. Since the dispersion pattern of commercially available LEDs are usually too narrow or too broad for use in light activated remote control systems, a modified cylindrical lens is used to shape the dispersion pattern of an LED. The resulting dispersion pattern is broad in the horizontal plane to overcome operator difficulty in horizontally aiming the transmitter towards the receiver. Since in the past it has been determined that horizontal aiming is more difficult to achieve than vertical aiming, the energy content in the horizontal plane is increased at the expense of the vertical plane thus improving the performance of the light transmitter. The dispersion pattern for the lens is controlled by altering the angle of the sidewalls. Further transmitter efficiency is achieved by directly bonding the LED to the lens thus removing losses which occur when an air surface exists between two optical mediums. The transmitter will work well with a number of receivers. One such receiver is described in a copending application filed on the same date as the present application in the name of Eugene P. Mierzwinski and entitled Remote Control Light Receiver, Ser. No. 626,165, common assignee.

It is an object of this invention to provide a light transmitter with a controlled beamwidth.

It is a further object of this invention to reduce the losses in a light transmitter.

DESCRIPTION OF THE PREFERRED EMBODIMENT

Figure 1:
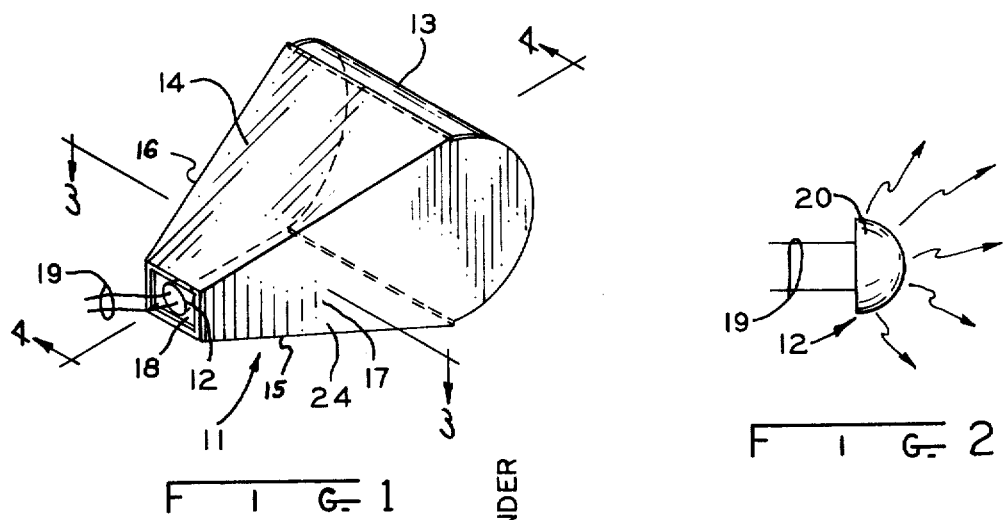
FIG. 1 is a perspective view of the light transmitter.

Referring to FIG. 1, the transmitter comprises a lens 11 for shaping the radiation pattern of a light emitting diode (LED) 12. The lens 11 has a convex cylindrical surface 13 having an axis of curvature 139 which forms the object side of the lens 11. The cylindrical lens front 13 produces a line focus as shown. Positioning the LED between the focus and cylinder surface 13 changes the light dispersion. Further control of the dispersion angle of the lens is achieved by converging the surfaces 14, 15 subtending the cylindrical arc. These surfaces 14, 15 are coated with a reflective material 24. Light incident to the surfaces is reflected out the front lens surface 13. Without the reflective coating, light incident to these surfaces 14, 15 at an angle greater than the critical angle would pass through the surfaces and not reach the remote control receiver. The angle these surfaces 14, 15 make with each other aid in determining the vertical dispersion angle of the transmitter. The walls 16, 17 subtending the length of the cylindrical face 13 also converge towards a line to the rear of the front surface 13. They are similarly coated with a reflective material and shape the horizontal dispersion pattern. The lens material is plexiglass having an index of refraction of 1.36 at a wavelength of 940nm. Other materials will suggest themselves to those skilled in the art.

Figure 2:
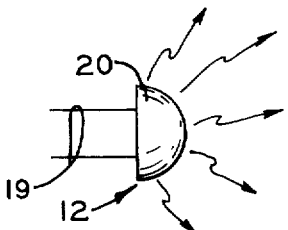
FIG. 2 is an illustration view of the light emitting diode used to convert electrical signals into light energy.

The LED 12 is located in a hole in the rear surface 18 of the lens 11. The preferred location for the LED 12 was experimentally determined to be in front of the lens focus. The LED 12 is bonded to the lens 11 with a clear epoxy having an index of refraction substantially the same as the index of refraction of lens 11. This reduces losses which would otherwise occur with an air interface between the LED 12 and the lens 11. Referring to FIG. 2, the overall outline of the LED is shown. The lead wires 19 supply electrical current to the junction of the diode. The diode is encapsulated in a lens cap 20. When the lens cap 20 is bonded to the lens 11 a continuous optical medium is formed. As noted above, this structure minimizes losses that would occur with air between different optical surfaces.

Figure 3:
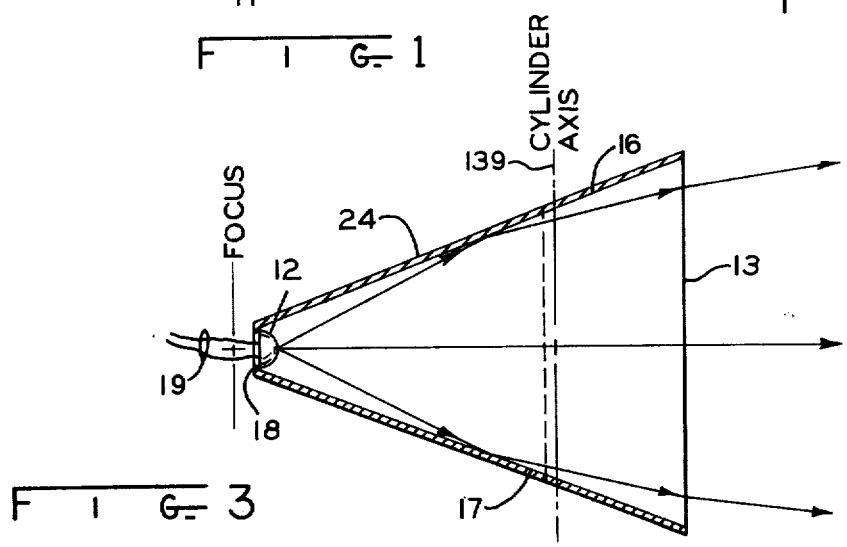
FIG. 3 is a sectional view of the light transmitter illustrating the horizontal light dispersion of the transmitter.

FIG. 3 illustrates the transmitter operation in the horizontal plane. Light originating from the LED 12 which is incident to the side walls 16, 17 is reflected out the front of the lens. The transmitter angle of dispersion is controlled by the angle between surfaces 14, 15 and the location of the LED. Positioning the LED forward of the focus minimizes the effect of the LED position on the dispersion angle.

Figure 4:
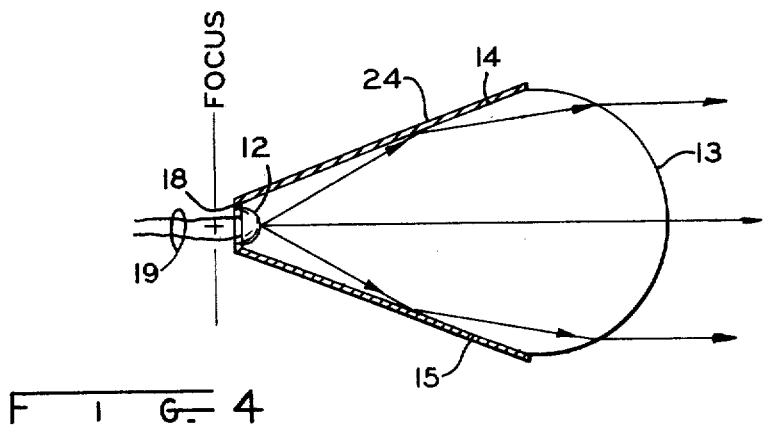
FIG. 4 is a sectional view of the light transmitter illustrating the vertical light dispersion of the transmitter.

FIG. 4 illustrates the operation of the lens in the vertical plane. The surfaces 16, 17 control the transmitter horizontal dispersion angle in a method similar to that of surfaces 14, 15 of FIG. 3. By reducing the angle between surfaces 14, 15 the vertical dispersion angle is reduced. Since the transmitter vertical location with respect to the receiver location is restricted, it is desirable to restrict the vertical dispersion in favor of distributing more energy in the horizontal dispersion angle. Those skilled in the art will recognize other energy dispersion patterns which this invention may be readily modified to produce.

The following specifications are given by way of example only of one embodiment of a light transmitter. Specifics for other applications will be obvious to those skilled in the art.

Cylinder radius 7/16 inch
Cylinder width ⅝ inch
Overall length ⅝ inch
Rear surface L x W ¼ inch × ¼ inch
LED type GE 55C
Lens material Plexiglass
LED distance to front surface ½ inch

What is claimed is:

1. A lens for transmitting light formed of optical material and having a front light transmitting surface, planar side surfaces, a planar top surface and a planar bottom surface, said front surface being cylindrical about an axis of curvature, said side surfaces being convergent toward a first line located rearwardly of said front surface and said top and bottom surfaces being convergent toward a second line located rearwardly of said front surface.

2. The lens of claim 1 further comprising a reflective coating covering at least a portion of each side surface adjacent said front surface.

3. The lens of claim 1 further comprising a reflective coating covering each of said side surfaces.

4. The lens of claim 1 further comprising a reflective coating covering each of said side surfaces, said top surface, and said bottom surface.

5. A transmitter for transmitting light comprising a lens formed of optical material having a front surface, said front surface being cylindrical about an axis, said axis being located rearwardly of said front surface; side surfaces; a top surface; a bottom surface; and further comprising a light emitting diode located within said optical materials.

6. The transmitter of claim 5 wherein said side surfaces are planar and converge toward a line located rearwardly of said front surface.

7. The transmitter of claim 6 wherein said top and bottom surfaces are planar and converge toward a line located rearwardly of said front surface.

8. The transmitter of claim 6 further comprising a reflective coating covering at least a portion of each of said side surfaces adjacent said front surface.

9. The transmitter of claim 6 further comprising a reflective coating covering each of said side surfaces.

10. The transmitter of claim 7 further comprising a reflective coating covering each of said side surfaces, said top surface and said bottom surface.

11. A lens for transmitting light formed of optical material and having a front light transmitting surface, planar side surfaces, a planar top surface and a planar bottom surface, said front surface being cylindrical about an axis of curvature, said side surfaces being convergent toward a first line located rearwardly of said front surface and said top and bottom surfaces being convergent toward a second line located rearwardly of said front surface and means for mounting a light emitting diode within said optical material.

12. A lens for transmitting light formed of optical material and having a front light receiving surface, planar side surfaces, a planar top surface, a planar bottom surface, and a rear surface, said front surface being cylindrical about an axis of curvature, said side surfaces subtending the length of said front surface and said top and bottom surfaces subtending the arc of said front surface, said side surfaces being convergent toward a first line located rearwardly of said front surface, and said top and bottom surfaces being convergent toward a second line located rearwardly of said rear surface, and said rear surface having a cavity therein for receiving a light emitting diode.

13. The lens of claim 12 further comprising a reflective coating covering at least a portion of each of said side, top, and bottom surfaces adjacent said front surface.

14. A light transmitter comprising the lens of claim 12 and a light emitting diode located within said cavity.

15. The light transmitter of claim 14 wherein said light emitting diode is adhered within said cavity by an adhesive material having an index of refraction substantially equal to the index of refraction of said optical material so that said adhesive material and said optical material cooperate to substantially eliminate any optical surface at their interface.

16. The apparatus of claim 5 wherein said light emitting diode is located between said axis and said front surface optical focus.

* * * * *